United States Patent [19]

Graham

[11] Patent Number: 4,459,558

[45] Date of Patent: Jul. 10, 1984

[54] PHASE LOCKED LOOP HAVING INFINITE GAIN AT ZERO PHASE ERROR

[75] Inventor: Martin Graham, Berkely, Calif.

[73] Assignee: Rolm Corporation, Santa Clara, Calif.

[21] Appl. No.: 314,727

[22] Filed: Oct. 26, 1981

[51] Int. Cl.[3] .......................... H03B 5/36; H03L 7/08
[52] U.S. Cl. ..................................... 331/1 A; 331/17; 331/25; 331/36 C; 331/177 V; 331/DIG. 3
[58] Field of Search ..................... 331/1 A, 14, 17, 25, 331/27, 36 C, 158, DIG. 3, 177 V

[56] References Cited

U.S. PATENT DOCUMENTS

| | | | |
|---|---|---|---|
| 3,503,003 | 3/1970 | Grobert | 331/27 X |
| 3,560,879 | 2/1971 | Fuchs | 331/158 X |
| 3,670,255 | 6/1972 | DeNicolay et al. | 331/27 X |
| 3,805,180 | 4/1974 | Widmer | 331/25 X |
| 4,055,814 | 10/1977 | Abraham et al. | 331/1 A |

*Primary Examiner*—Siegfried H. Grimm
*Attorney, Agent, or Firm*—Blakely, Sokoloff, Taylor & Zafman

[57] ABSTRACT

A phase-locked loop for use in the common T1 systems. The phase relationship of the clock pulse output of a voltage controlled oscillator is determined with respect to an incoming data pulse train. If the clock signal leads the data signal, an error signal of a first polarity is applied to an integrator whose output is provided to the VCO to reduce the frequency of the clock pulse. If the clock signal lags the data signal, an error signal of a second polarity is applied to the integrator whose output is provided to the VCO to increase the frequency of the clock pulse. The logic of the circuitry is such that the output of the integrator is always either increasing or decreasing, even if there is zero phase error between the clock pulse and data pulse (i.e. the loop has infinite gain for zero error). The integrator continues to integrate in a first direction until the frequency of the clock pulses is adjusted so far that the lead is changed to a lag or vice-versa, with respect to the next data pulse.

2 Claims, 4 Drawing Figures

PHASE LOCKED LOOP HAVING INFINITE GAIN AT ZERO PHASE ERROR

SUMMARY OF THE INVENTION

A phase-locked loop is provided for use in the common T1 systems (T1 system is a recognized serial bit transmission system, operating at approximately 1.544 mHz, the present invention, however, is not limited to this specific transmission mode). The phase relationship of the clock pulse output of a voltage controlled oscillator is determined with respect to an incoming data pulse train. If the clock signal leads the data signal, an error signal of a first polarity is applied to an integrator whose output is provided to the VCO to reduce the frequency of the clock pulse. If the clock signal lags the data signal, an error signal of a second polarity is applied to the integrator whose output is provided to the VCO to increase the frequency of the clock pulse. The logic of the circuitry is such that the output of the integrator is always either increasing or decreasing, even if there is zero phase error between the clock pulse and data pulse (i.e. the loop has infinite gain for zero error). The integrator continues to integrate in a first direction until the frequency of the clock pulses is adjusted so far that the lead is changed to a lag or vice-versa, with respect to the next data pulse.

DETAILED DESCRIPTION OF THE INVENTION

Figure 1:
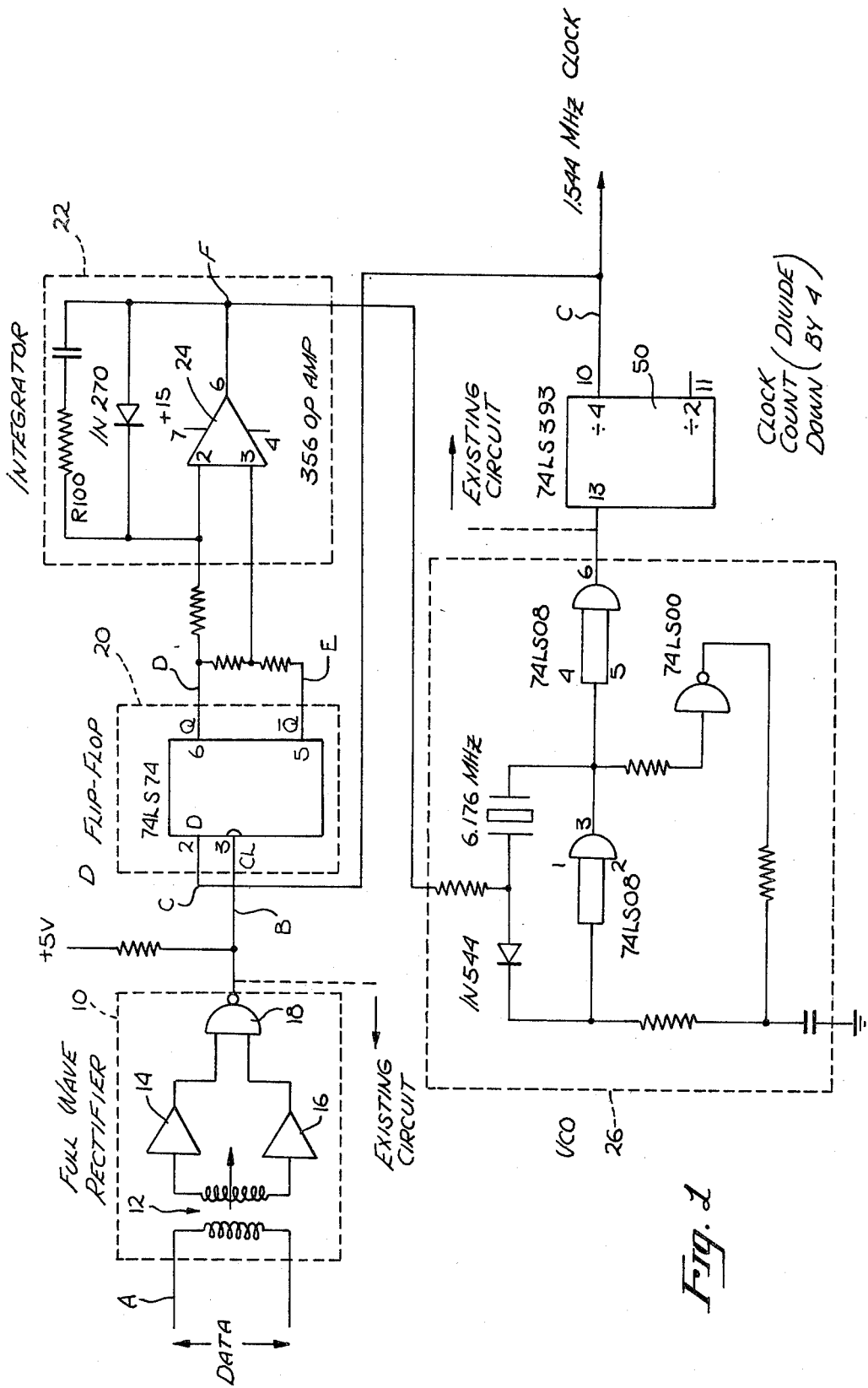
FIG. 1 is a schematic diagram of the circuit of the phase-locked loop of the present invention.

A data pulse train, such as is common in the typical T1 system, is passed through a full wave rectifier 10 and connected to the clock input terminal of a D-type flip-flop 20. The output signal (which is here used as a clock signal) of a voltage controlled oscillator 26 (VCO) is connected to the data input terminal of the D-type flip-flop 20. The state of the output signals Q and $\overline{Q}$ of the flip-flop 20 indicate whether the clock signal from the VCO 26 leads or lags the data pulse train. The output signals Q and $\overline{Q}$ are applied to the input terminals of an integrator 22 in such a manner that one polarity of input indicates lead and the opposite polarity indicates lag. The integrator 22, which has a resistor R100 which serves to damp oscillations in the integrator circuit, produces an output signal which is always either increasing (for the lead condition) or decreasing (for the lag condition). The output signal from the integrator 22 is applied to the input of the VCO 26 to change its frequency and thereby bring it back into phase with the data pulse train. While this is a simplified explanation of the operation of the circuit of FIG. 1, it does assist one's understanding and appreciation of the more detailed explanation which follows.

The VCO 26 utilizes an AND gate as an ordinary amplifier. The output pin 3 of this AND gate is coupled through a feedback loop to the input pins 1 and 2 of this gate. This feedback loop includes a crystal and a varactor. The potential applied between these components varies the capacitance of the varactor and hence, changes the frequency of oscillation at the output of the gate. The other path between the output of this gate and its input which includes the inverter, Part No. 74LS00 controls the DC operating point for this amplifier. The oscillator oscillates at the series resonance frequency determined by the crystal and the varactor. The second AND gate shown within VCO 26 (input pins 4 and 5 and output pin 6) is used as a buffer.

Figure 2:
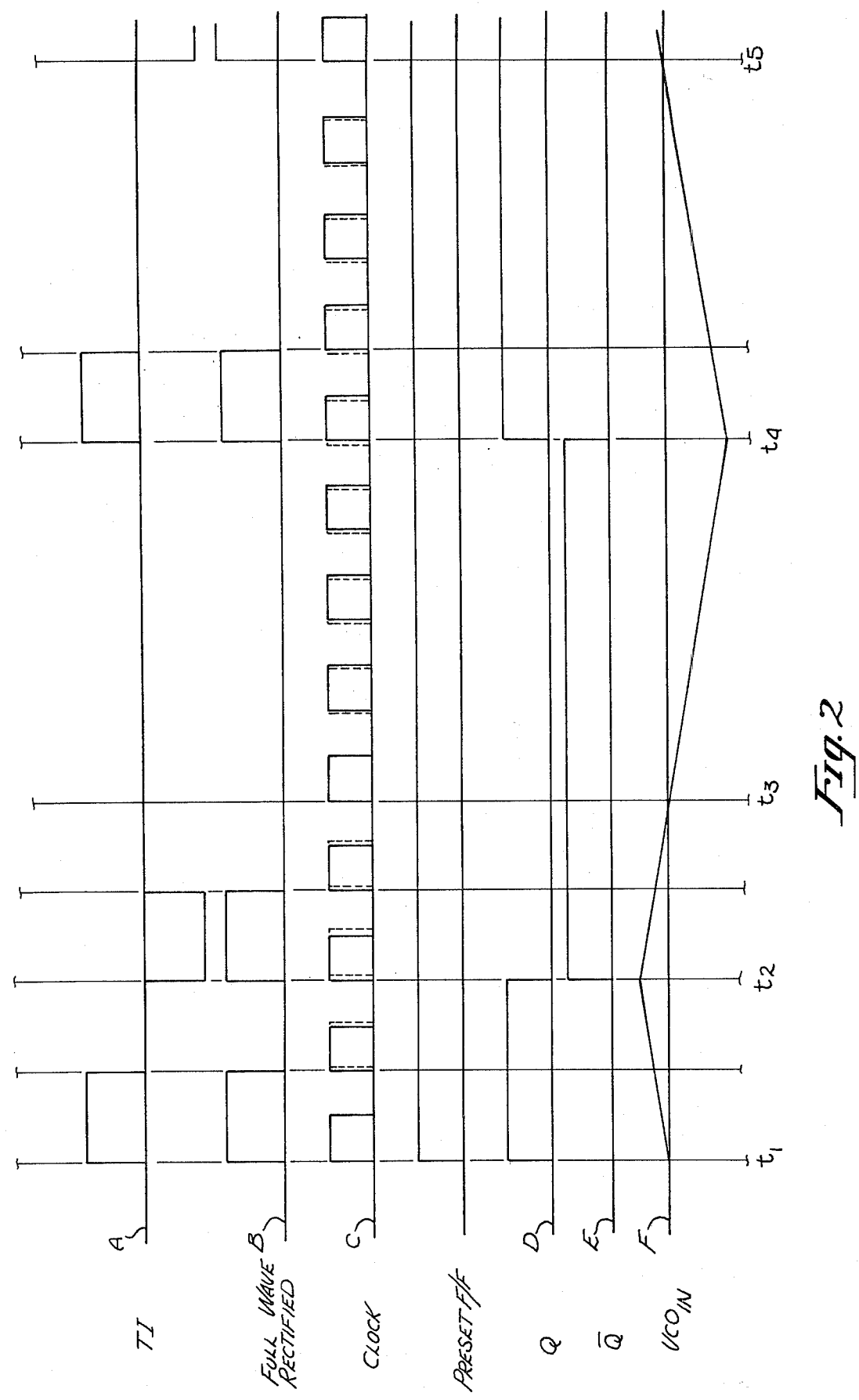
FIG. 2 is a timing diagram of the electrical signals at various points in the circuit.

Full wave rectifier 10 processes the incoming T1 type data pulse train, appearing at point A in the circuit (see FIG. 2), through a transformer 12, op amps 14 and 16 and NAND gate 18 to produce a full wave rectified data pulse train at point B (see FIG. 2). The full wave rectified data pulse train is applied to clock pin (pin 3) of a bistable circuit such as the D-type flip-flop 20. To the data pin (pin 2) of the flip-flop 20 is provided the 1.544 MHZ clock pulse (at point C in the Circuit) generated by the VCO. The particular flip-flop 20 shown in FIG. 1 is a 74LS74, a dual D positive edge triggered device, with preset and clear. Such a device sets (or clocks) on each positive going edge of the signal on the clock input (pin 3). When the device triggers, the Q output follows the input and the $\overline{Q}$ output is the logical compliment of the Q output. The truth table for this device is shown below.

| INPUTS | | | | OUTPUTS | |
|---|---|---|---|---|---|
| PR | CLR | CLK | D | Q | $\overline{Q}$ |
| L | H | X | X | H | L |
| H | L | X | X | L | H |
| L | L | X | X | H | H |
| H | H | ↑ | H | H | L |
| H | H | ↑ | L | L | H |
| H | H | L | X | QO | QO |

PR represents the preset signal, CLR the clear signal, CLK the clock signal, and D the input at the D terminal. The two outputs are shown as Q and $\overline{Q}$. H represents high, L low, and X means that the state of signal does not effect the output. The upwardly pointing arrow indicates the rising edge of the clock signal. The last two entries of the outputs indicate that the Q and $\overline{Q}$ terminals remain at their prior state.

Since the full wave rectified data pulse train is applied to the clock pin (pin 3) of the flip-flop 20, and the clock pulse train (i.e. signal at point C) is applied to the data pin (pin 2) of the flip-flop 20, the flip-flop will trigger whenever a positive going edge of a pulse is encountered in the data pulse train (at point B). When the flip-flop triggers, the output Q follows the input (i.e. clock pulse train on pin 2) and the $\overline{Q}$ output is the logical compliment of the Q output. Hence, the combination Q high, $\overline{Q}$ low indicates a lag, and Q low $\overline{Q}$ high indicates a lead (or coincidence) of the clock pulse train (on point C), with respect to the data pulse train (on point B). For example, with reference to FIG. 2, at time $t_1$, we have a positive going edge of a data pulse on the clock pin (pin 3), i.e. the full wave rectified data pulse train at point B presents a positive going edge. At this time $t_1$, the signal on the data pin (pin 2), i.e. the clock signal from the VCO 26 appearing at point C, is logical high. Thus, when the flip-flop 20 is triggered by the positive going edge of the signal on point B, the Q output will also be a logical high, and the $\overline{Q}$ output will be a logical low. This output combination of the flip-flop 20 produces an input signal to the integrator 22 on pins 2 and 3 of the op amp 24 of positive polarity. The integrator 22 begins integrating the input step voltage and thus gradually increases the voltage appearing at the integrator 22 output point F. This increasing voltage VCO$_{in}$ in FIG. 2 is applied to the VCO and produces a gradual reduction in the frequency of oscillation of the VCO 26. This reduction in frequency of the clock signal (i.e. VCO output as appears at point C) introduces a slight bit of lag. The clock signal at point C thus begins to lag the data signal on point B by an ever increasing amount as time progresses from $t_1$ and $t_2$.

At time $t_2$, the increasing voltage level out of the integrator 22 (i.e. at point F) has caused increasing lag of the clock signal (on point C) with respect to the data pulse signal on point B. Thus, when the positive going leading edge of the signal on point B occurs at time $t_2$, the clock pulse has shifted from that indicated by the solid line, to that indicated by the phantom line. Thus, when the flip-flop 20 triggers at time $t_2$, the lagging clock pulse (in phantom) has not yet arrived, so output Q goes logically low and $\overline{Q}$ goes logically high. (See signals on points D and E at time $t_2$ of FIG. 2). This causes a reversal in the polarity of the signal input to the integrator 22. The integrator now begins to gradually integrate to reduce its output voltage at point F. Hence the voltage applied to the VCO 26, i.e. VCO$_{in}$, begins to decrease. The decrease in VCO$_{in}$ causes the frequency of the VCO to gradually increase. The increasing frequency induces lead (i.e. reduces the lag) in the clock signal (at point C) with respect to the data pulse train (at point B). At point $t_3$ the lag has been reduced to zero. The integrator 22 continues to integrate its output (signal on point F) downward, (i.e. reduces its output voltage), increasing the frequency of the VCO and inducing increasing lead into the clock pulse train with respect to the data pulse train (on point B) during the time interval $t_3$ to $t_4$.

At point $t_4$, the clock pulse (in phantom lines) leads the data pulse (on B). Thus, at $t_4$, when the data pulse (which is applied to the clock pin, pin 3, of the flip-flop 20) triggers the flip-flop, the clock pulse is also present on pin 2. Thus output Q goes to logical high and $\overline{Q}$ goes to logical low, again reversing the polarity of the input to the integrator 22. The integrator thus begins to integrate in the opposite direction, i.e. to increase its output voltage at point F. This increasing output voltage is applied to the VCO to gradually reduce the frequency of the clock, i.e. induce lag. This gradually reduces the amount of lead originally present at $t_4$ until, as shown at $t_5$, there is zero lag, and zero lead. If, at $t_5$, another data pulse were present as shown on point B, the flip-flop 20 would be triggered by the data pulse, and even though the clock is in phase (i.e. the phase error equals zero), the presence of the clock signal, at the time the data pulse triggers the flip-flop 20, causes the Q output to remain a logical high and the $\overline{Q}$ to remain logical low. The integrator 22 thus continues to gradually increase its output voltage, lowering the frequency of the VCO and inducing additional lag. This continued presence of a correction signal (i.e. F signal is not zero) even when there is no phase error, gives the phase locked loop of the present invention an infinite gain (i.e. error signal present without presence of error).

From the above discussion, it is evident that the frequency of the VCO is constantly being adjusted, either upward or downward, even when no phase error exists.

Figure 3:
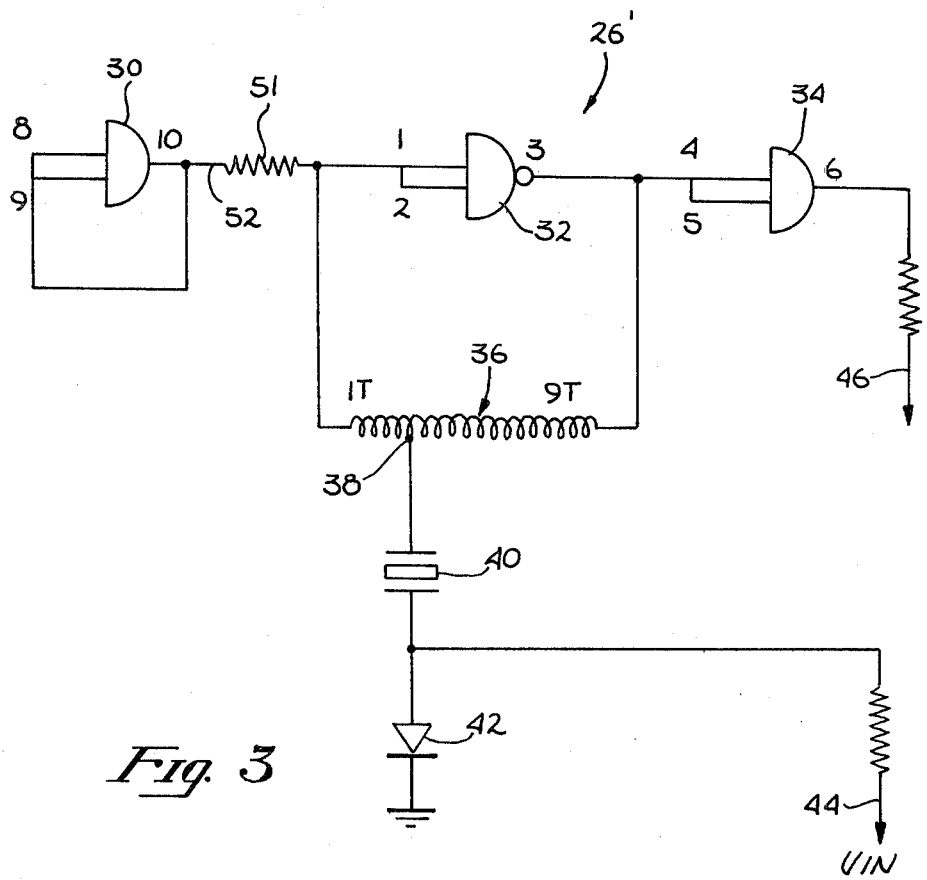
FIG. 3 illustrates an alternate configuration for the voltage controlled oscillator portion of the circuit.
Figure 4:
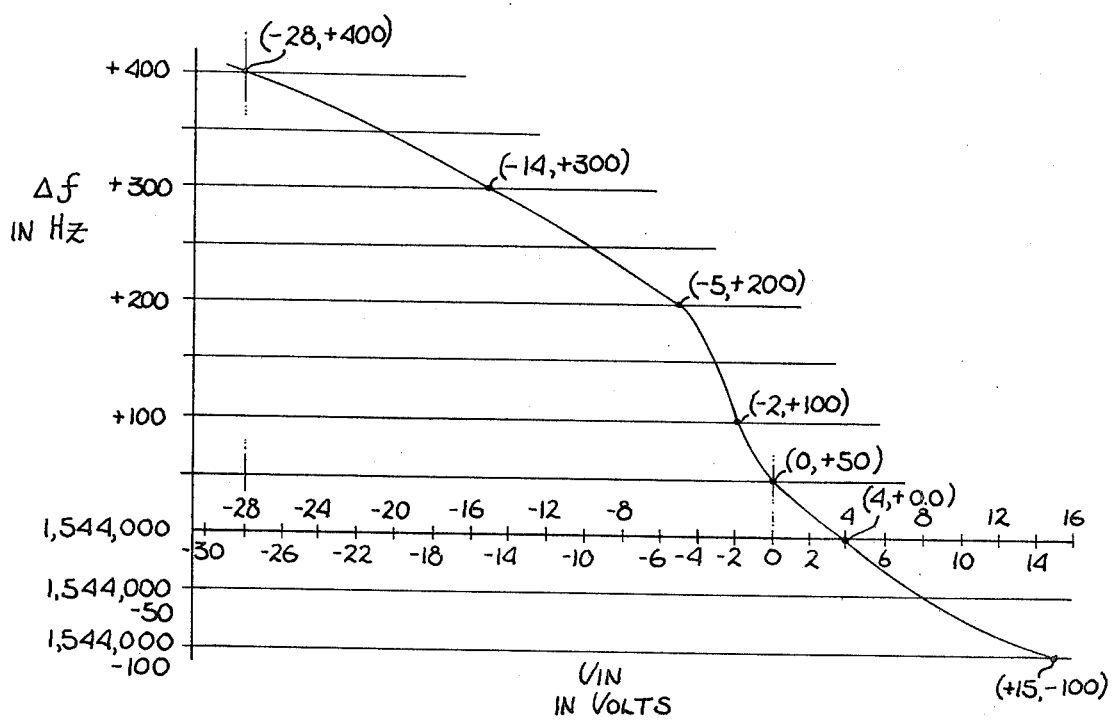
FIG. 4 illustrates the change in frequency of the oscillator as a function of voltage.

An improved configuration of VCO 26 is shown in FIG. 3 and designated 26'. The improved configuration VCO 26' employs three AND gates, 30, 32 (which is inverting) and 34. AND gate 30 has its output (on pin 10) fed back around to its input to establish a quiescent voltage of about 1.8 volts on its output. AND gate 32 is the active element of the oscillator and has its output tied back to its input through coil 36. The low D.C. resistance of the coil 36 provides negative feedback and stabilizes the D.C. operating point of the oscilator 26'. AND gate 34 serves as a buffer and provides isolation between the oscillator and the remainder of the circuitry. An adjustable tap point 38 is provided in coil 36 to pick off a voltage to provide to one terminal of crystal 40. The other terminal of crystal 40 is connected to the anode of varactor 42 which has its cathode connected to ground. The output signal of integrator 22 is applied to point 44 and serves to change the electrical parameters of varactor 42. Since the output frequency of oscillator 26' (appearing at point 46) is dependent largely on the characteristics of crystal 40 and varactor 42, and since the capacity of varactor 42 changes with changes in the voltage applied across the varactor, a change in output voltage of integrator 22 will change the frequency of oscillator 26'. More specifically, if the voltage at point 44 goes more negative, the varactor capacitance decreases. Thus the output frequency of the oscillator 26' at point 46 goes up. This relationship of voltage and frequency is graphically illustrated in FIG. 4.

It should be noted that oscillator 26' can replace oscillator 26 on a connection for connection basis. Thus each circuit has a ground connection, each circuit has an input signal originating at the output from the integrator 22, and each circuit has an output signal which is the input to pin 13 of the divide by four countdown designated item 50.

Oscillator 26' has certain advantages not present in oscillator 26. First, the low D.C. resistance of the coil 36 keeps the resistance in the feedback path to a minimum thereby virtually eliminating the senstivity of the oscillator 26' to variations in temperature. Second, by adjusting the location of tap 38 in coil 36, a more precise matching of input impedance, output impedance and crystal parameters can be achieved. Third, whereas oscillator 26 requires two AND gates (i.e. two 74LS08s) to achieve a signal inversion, oscillator 26' requires only the single inverting AND gate 32. Thus, the phase of oscillator 26 is more sensitive to voltage and temperature that that of oscillator 26', or in other words, oscillator 26' exhibits better frequency stability.

While the invention has been particularly described in alternate embodiments with reference to FIGS. 1 through 4, the discussion and Figures are for purposes of illustration and should not be interpreted as limitations upon the invention. Many changes in circuit configuration could be made, while maintaining the same basic operational characteristics, by one of ordinary skill in the art, without departing from the spirit and scope of the invention. For example, if, in the oscillator circuit 26' the two AND gates are modified to operate in the open collector configuration, the AND gate 30 can be eliminated and a +5 v supply could be applied to the resistor 51 at point 52 in substitution for the +1.8 v quiescent voltage produced by AND gate 30. The scope of the invention is intended to be set forth in the appended claims.

What is claimed is:

1. A phase locked loop, for controlling the phase relationship between a clock signal pulse train and an input data pulse train, comprising:
generation means for generating a clock signal pulse train comprising:
an inverting amplifier;
a coil with a tap, having low DC resistance, connected from the input to the output of said inverting amplifier;
a crystal resonator having one terminal connected to said tap of said coil, and its other terminal connected to the anode of a varactor;
said varactor having its cathode connected to ground;
an incoming data pulse train;
means for determining the phase relationship (lead or lag) between said clock signal pulse train and said data pulse train and for generating an output signal having a polarity indicative of said phase relationship, said means being configured to generate an output signal even when said clock signal pulse train and said data pulse train are precisely in phase;
an integrator responsive to said output signal for generating a control signal, the control signal of said integrator being applied through a resistance to the anode of said varactor;
said means for generating a clock signal pulse train being responsive to said control signal to adjust the frequency of said clock signal pulse train in a manner to change the phase relationship from lead to lag or from lag to lead,
whereby changes in said control signal magnitude cause a change in the frequency of said clock signal pulse train.

2. The phase locked loop of claim 1 wherein said means for determining comprises:
a bistable circuit having said data pulse train as the input to the clock pin of said bistable circuit and having said clock signal pulse train as the input to the data pin of said bistable circuit.

* * * * *